(12) United States Patent
Lee

(10) Patent No.: US 10,778,256 B2
(45) Date of Patent: Sep. 15, 2020

(54) MEMORY SYSTEM AND OPERATING METHOD THEREOF

(71) Applicant: SK hynix Inc., Gyeonggi-do (KR)

(72) Inventor: Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 65 days.

(21) Appl. No.: 16/013,153

(22) Filed: Jun. 20, 2018

(65) Prior Publication Data

US 2019/0140666 A1 May 9, 2019

(30) Foreign Application Priority Data

Nov. 7, 2017 (KR) .................. 10-2017-0147391

(51) Int. Cl.
| | |
|---|---|
| H03M 13/29 | (2006.01) |
| G06F 11/10 | (2006.01) |
| H03M 13/15 | (2006.01) |
| H03M 13/11 | (2006.01) |
| G11C 29/52 | (2006.01) |
| H03M 13/00 | (2006.01) |
| H03M 13/37 | (2006.01) |
| G11C 29/04 | (2006.01) |

(52) U.S. Cl.
CPC ..... *H03M 13/2906* (2013.01); *G06F 11/1048* (2013.01); *G06F 11/1068* (2013.01); *G11C 29/52* (2013.01); *H03M 13/1102* (2013.01); *H03M 13/1108* (2013.01); *H03M 13/1111* (2013.01); *H03M 13/152* (2013.01); *H03M 13/3715* (2013.01); *H03M 13/6325* (2013.01); *G11C 2029/0411* (2013.01)

(58) Field of Classification Search
CPC ......... H03M 13/2906; H03M 13/1102; H03M 13/152; G11C 29/52; G11C 2029/0411; G06F 11/1068
See application file for complete search history.

(56) References Cited

U.S. PATENT DOCUMENTS

| | | | | |
|---|---|---|---|---|
| 2009/0241010 A1* | 9/2009 | Yano | ................. | G06F 11/1072 714/764 |
| 2015/0309872 A1* | 10/2015 | Cai | ................. | G06F 11/1024 714/764 |
| 2016/0103735 A1* | 4/2016 | Lee | ................. | H03M 13/157 714/764 |
| 2018/0013450 A1* | 1/2018 | Hsiao | ................. | G06F 11/1068 |
| 2018/0253347 A1* | 9/2018 | Shigeta | ................. | G06F 11/0751 |

FOREIGN PATENT DOCUMENTS

| | | |
|---|---|---|
| KR | 1020090066691 | 6/2009 |
| KR | 1020160043578 | 4/2016 |

\* cited by examiner

*Primary Examiner* — Thien Nguyen

(74) *Attorney, Agent, or Firm* — IP & T Group LLP

(57) ABSTRACT

A method of operating a memory system includes reading, by a controller, first data from a first memory block, performing a first error correction on the first data using a first ECC circuit, performing a second error correction on the first data using a second ECC circuit when a result of the first error correction indicates a failure, and performing, by the controller, a read reclaim operation on the first memory block when the result of the first error correction indicates the failure.

18 Claims, 12 Drawing Sheets

MEMORY SYSTEM AND OPERATING METHOD THEREOF

CROSS-REFERENCE TO RELATED APPLICATION

The present application claims priority under 35 U.S.C. § 119(a) to Korean patent application number 10-2017-0147391, filed on Nov. 7, 2017, the entire disclosure of which is incorporated herein by reference in its entirety.

BACKGROUND

1. Field of Invention

Various embodiments of the invention relate to a memory system and an operating method thereof and, more particularly, to a memory system and method for performing an error correction operation on data using a second ECC circuit when an error correction operation a first ECC circuit fails, and performing a read reclaim operation on a memory block storing the data.

2. Description of Related Art

A memory device may include a plurality of memory blocks each including a plurality of memory cells. An erase operation is typically performed simultaneously on all memory cells which are included in a single memory block.

Generally, when a plurality of read operations are performed on a memory block, data stored in the memory block may be degraded due to a "read disturb" phenomenon. Specifically, the threshold voltages of memory cells may be increased by an electric field generated by a voltage applied to the memory block resulting in a widening of the threshold voltage distribution of the memory cells. When read disturb widens the threshold voltage distribution of the memory cells of a memory device, the data error rate may increase substantially. In addition, if the threshold voltage distribution of the memory cells widens excessively, then an operation for correcting the data errors may fail during a read operation. To address this concern, a memory system may perform a read reclaim operation which includes copy-programming data stored in a memory block before the error correction operation fails to another memory block.

SUMMARY

Various embodiments of the invention are directed to a memory system performing an improved read reclaim operation and an operating method thereof.

In accordance with an embodiment, a method of operating a memory system may include reading, by a controller, first data from a first memory block, performing a first error correction on the first data using a first error correction (ECC) circuit, performing a second error correction on the first data using a second ECC circuit when a result of the first error correction indicates a failure, and performing, by the controller, a read reclaim operation on the first memory block when the result of the first error correction indicates the failure.

In accordance with an embodiment, a memory system may include a first memory block and a second memory block, a first ECC circuit performing a first error correction operation on data read from the first memory block, a second ECC circuit performing a second error correction operation on the data when the first error correction operation fails, and a read reclaim control section performing a read reclaim operation to copy-program data stored in the first memory block to the second memory block when the first error correction operation fails, wherein the second ECC circuit has a higher error correction capability than the first ECC circuit.

In accordance with an embodiment, a method of operating a memory system may include reading data from a memory block, performing a first error correction operation on the data based on a first error correction sequence, performing a second error correction operation on the data based on a second error correction sequence when the first error correction operation fails, adding information of the memory block to a reclaim list in response to a failure of the first error correction operation, and performing a read reclaim operation based on the reclaim list.

In accordance with an embodiment, a method of operating a memory system may include performing a first ECC operation to data readout from a memory block, performing a read reclaim operation to the memory block when the first ECC operation fails, and performing a second ECC operation having a higher error correction capability than the first ECC operation on the data readout from the memory block when the first ECC operation fails.

These and other features and advantages of the present invention will become apparent to those with ordinary skill in the art to which the present invention belongs from the following description in conjunction with the accompanying drawings.

DETAILED DESCRIPTION

Figure 1:
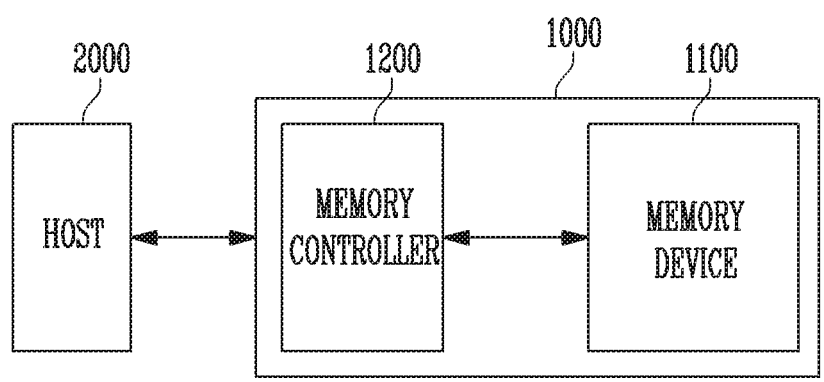
FIG. 1 is a simplified block diagram illustrating a memory system in accordance with an embodiment.

Hereinafter, various exemplary embodiments of the invention will be described in detail with reference to the accompanying drawings. In the drawings, various dimensions such as, for example, thicknesses and lengths of components may be exaggerated for convenience of illustration. In the following description, a detailed description of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. In addition, throughout the specification, the terms "comprising" and "including" and various forms thereof are used interchangeably. Hence, when it is said that an element A includes a certain element B, this does not exclude other elements from being included and, therefore, element A may further include besides element B another element or elements.

FIG. 1 is a simplified block diagram illustrating a memory system in accordance with an embodiment of the invention.

Referring to FIG. 1, the memory system 1000 may include a memory device 1100 storing data and a memory controller 1200 controlling the memory device 1100. The memory system 100 may be operatively coupled to a host 2000. The memory system 1000 may perform one or more operations in response to control commands and or data received from the host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory controller 1200 may control the general operations of the memory system 1000 and control a data exchange between the host 2000 and the memory device 1100. For example, the memory controller 1200 may control the memory device 1100 to program or read data in response to a request (command) received from the host 2000. In addition, the memory controller 1200 may store information about main memory blocks and sub-memory blocks included in the memory device 1100. The memory controller 1200 may control the memory device 1100 so that a program operation can be performed in a main memory block or a sub-memory block of the memory device 1100 according to the amount of data loaded for the program operation. In accordance with an embodiment, the memory device 1100 may be or include a flash memory.

The memory controller 1200 may transfer data received from the host 2000 to the memory device 1100 and store the data in the memory device 1100. In addition to the data received from the host 2000, the memory controller may receive a logical address from the host 2000. The controller 1200 may convert the logical address into a physical address indicating a region of the memory device 1100 where the received data should be stored.

Although only one memory device 1100 is illustrated in FIG. 1, we note that the invention is not limited in this way. For example, in another example, the memory system 1000 may include a plurality of memory devices 1100 coupled to the controller via one common channel or a plurality of dedicated channels. The memory controller 1200 may control the plurality of memory devices 1100 through the channel or channels.

Figure 2:
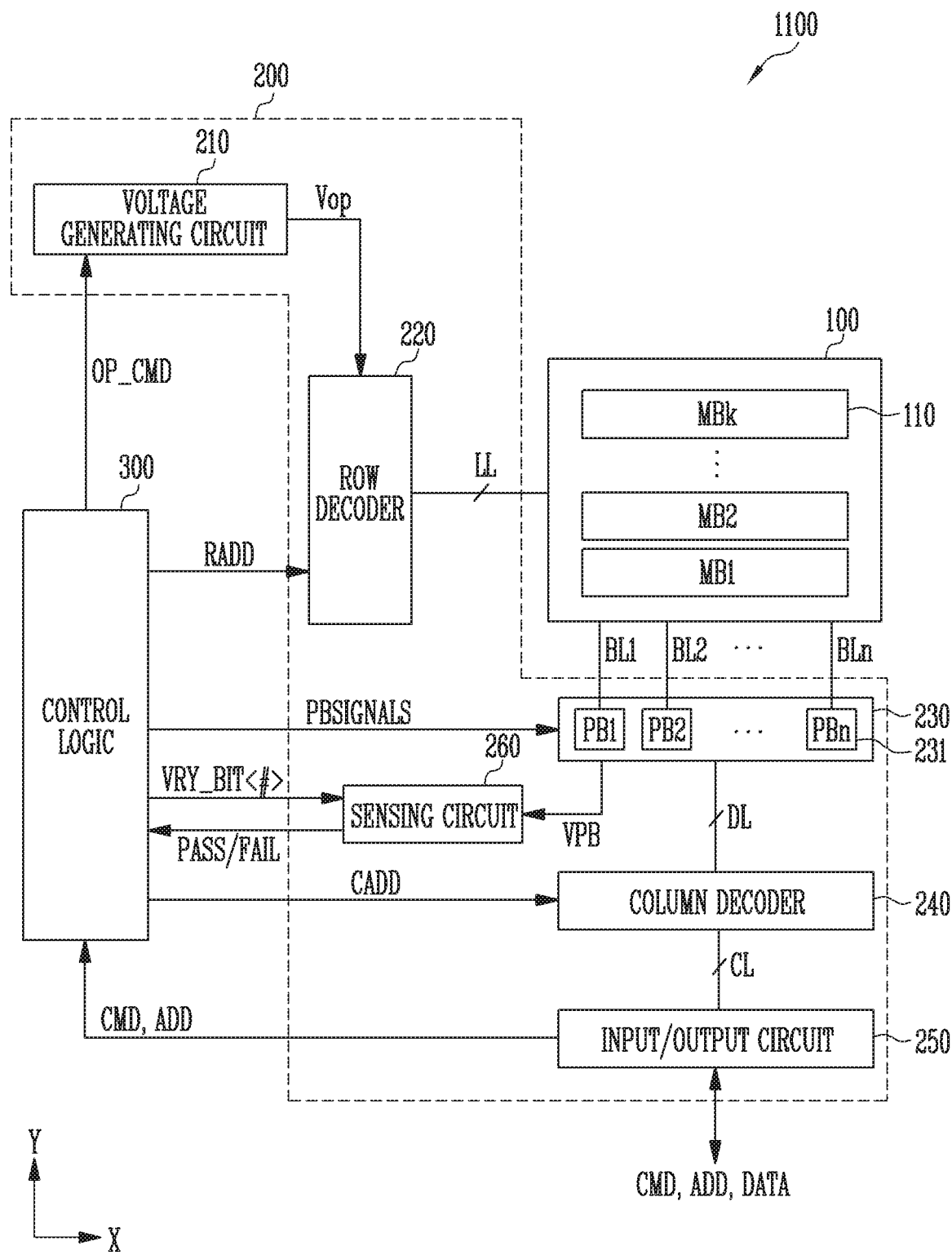
FIG. 2 is a simplified block diagram illustrating a memory device shown in FIG.

FIG. 2 is a simplified block diagram illustrating an exemplary configuration of the memory device 1100 shown in FIG. 1.

Referring to FIG. 2, the memory device 1100 may include a memory cell array 100 for storing data therein. The memory device 1100 may include peripheral circuits 200 configured to perform a program operation to store data in the memory cell array 100, a read operation to output the stored data, and an erase operation to erase the stored data. The memory device 1100 may include a control logic 300 which controls the peripheral circuits 200 in response to control of the memory controller 1200.

The memory cell array 100 may include a plurality of memory blocks BLK1 to BLKm 110, where m is a positive integer. Local lines LL and bit lines BL1 to BLn may be coupled to each of the memory blocks BLK1 to BLKm (110), where n is a positive integer. For example, the local lines LL may include a first select line, a second select line, and a plurality of word lines arranged between the first and second select lines. In addition, the local lines LL may include dummy lines arranged between the first select line and the word lines and/or between the second select line and the word lines. The first select line may be a source select line, and the second select line may be a drain select line. For example, the local lines LL may include word lines, drain and source select lines, and source lines. For example, the local lines LL may further include dummy lines. For example, the local lines LL may further include pipe lines. A set of dedicated local lines LL may be coupled to each of the memory blocks BLK1 to BLKm 110, whereas the bit lines BL1 to BLn may be coupled in common to the memory blocks BLK1 to BLKm 110. The memory blocks BLK1 to BLKm 110 may have a two-dimensional (2D) or three-dimensional (3D) structure. For example, in the two-dimensional memory blocks 110, memory cells may be arranged in parallel with a substrate. For example, in the three-dimensional memory blocks 110, memory cells may be stacked in a vertical direction to the substrate.

The peripheral circuits 200 may be configured to perform program, read, and erase operations on the selected memory block 110 in response to control of the control logic 300. For example, the control logic 300 may control the peripheral circuits 200 to supply a verify voltage and pass voltages to the first select line, the second select line, and the word lines, selectively discharge the first select line, the second select line and the word lines, and verify memory cells coupled to a selected word line, among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used to perform program, read, and erase operations in response to an operation signal OP_CMD. In addition, the voltage generating circuit 210 may selectively discharge the local lines LL in response to the operation signal OP_CMD. For example, the control logic 300 may control the voltage generating circuit 210 to generate a program voltage, a verify voltage, pass voltages, a turn on voltage, a read voltage, an erase voltage, and a source line voltage.

The row decoder 220 may transfer the operating voltages Vop to the local lines LL coupled to the selected memory block 110 in response to a row address RADD.

The page buffer group 230 may include a plurality of page buffers (PB1 to PBn) 231 coupled to the bit lines BL1 to BLn. The page buffers (PB1 to PBn) 231 may operate in response to page buffer control signals PBSIGNALS. For example, the page buffers (PB1 to PBn) 231 may temporarily store data received through the bit lines BL1 to BLn, or sense voltages or currents in the bit lines BL1 to BLn during a read or verify operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and the address ADD from the memory controller 1200 shown in FIG. 1 to the control logic 300, or exchange data DATA with the column decoder 240.

The sensing circuit 260 may generate a reference current in response to an allowable bit VRY_BIT<#> and compare a sensing voltage VPB received from the page buffer group 230 with a reference voltage generated by the reference current to output a pass signal PASS or a fail signal FAIL during a read operation or a verify operation.

The control logic 300 may output the operation signal OP_CMD, the row address RADD, the page buffer control signals PBSIGNALS and the allowable bit VRY_BIT<#> to control the peripheral circuits 200 in response to the command CMD and the address ADD. In addition, the control logic 300 may determine whether a verify operation passes or fails in response to the pass or fail signal PASS or FAIL.

In the operation of the memory device 1100, each memory block 110 may be the unit of an erase operation. In other words, a plurality of memory cells included in a single memory block 110 may be simultaneously erased but may not be selectively erased.

Figure 3:
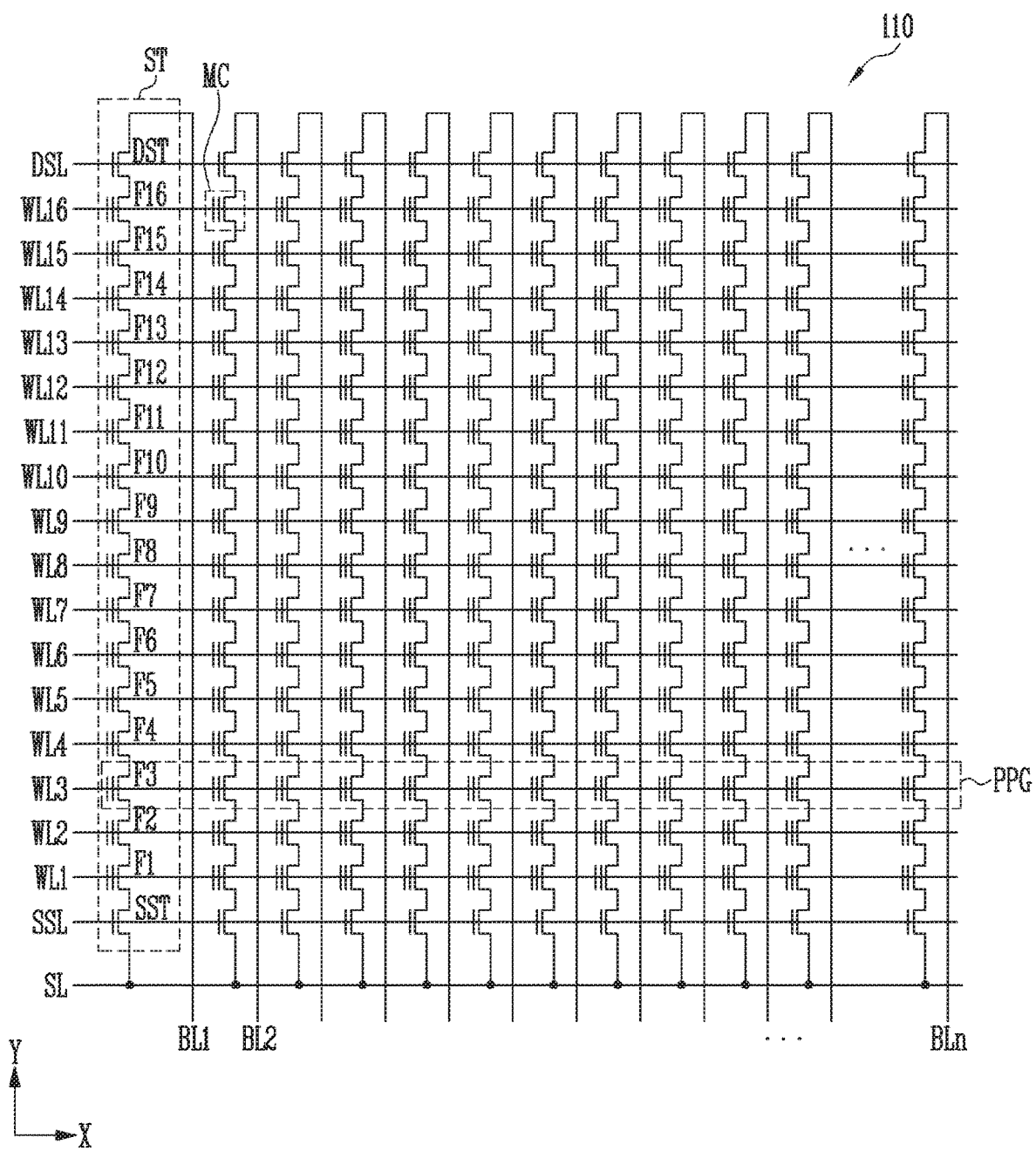
FIG. 3 is a simplified circuit diagram illustrating a memory block shown in FIG. 2.

FIG. 3 is a simplified circuit diagram illustrating the memory block shown in FIG. 2.

Referring to FIG. 3, the memory block 110 may be configured such that a plurality of word lines arranged in parallel with each other may be coupled between a first select line and a second select line. The first select line may be a source select line SSL and the second select line may be a drain select line DSL. More specifically, the memory block 110 may include a plurality of strings ST coupled between the bit lines BL1 to BLn and a source line SL. Each of the bit lines BL1 to BLn may be coupled to each of the strings ST, and the source line SL may be commonly coupled to the strings ST. Since the strings ST may have similar configurations to each other, the string ST coupled to the first bit line BL1 will be described in detail as an example.

The string ST may include a source select transistor SST, a plurality of memory cells F1 to F16 and a drain select transistor DST coupled in series between the source line SL and the first bit line BL1. A single string ST may include at least one source select transistor SST and at least one drain select transistor DST and may include more memory cells than the memory cells F1 to F16 as shown in FIG. 3.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block 110 may include as many physical pages PPG as the number of word lines WL1 to WL16.

A single memory cell may store one bit of data. This memory cell is generally called a single level cell (SLC). A single physical page (PPG) may store data corresponding to a single logical page LPG. Data corresponding to the single logical page LPG may include as many data bits as the number of cells included in the single physical page PPG. Further, a single memory cell (MC) may store two or more bits of data. This cell is typically referred to as a "multi-level cell (MLC)." The single physical page PPG may store data corresponding to two or more logical pages LPG.

A plurality of memory cells included in the single physical page PPG may be simultaneously programmed. In other words, the memory device 1100 may perform a program operation on each physical page PPG. A plurality of memory cells included in a single memory block may be simultaneously erased. In other words, the memory device 1100 may perform an erase operation on each memory block 110. For example, in order to update a portion of data stored in a single memory block (110), the entire data stored in the memory block 110 may be read, the portion of the data that is to be updated may be changed, and another memory block 110 may be programmed with the entire data. This update process may be performed since it may be impossible to erase only a portion of the data stored in the memory block 110 and program the memory block 110 with new data when the memory block 110 is the unit of an erase operation.

Figure 4:
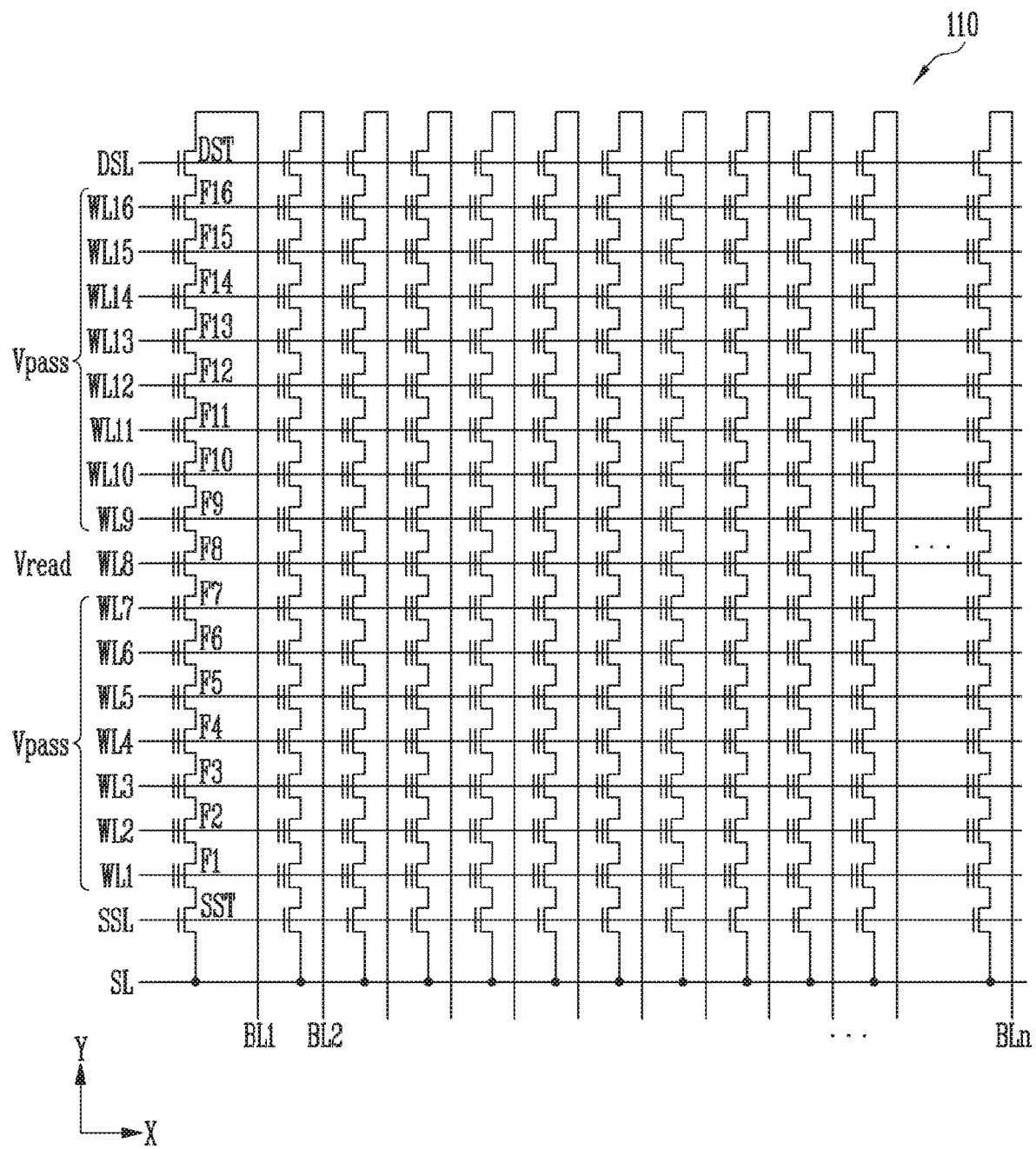
FIG. 4 is a simplified circuit diagram illustrating a read operation.

FIG. 4 is a simplified circuit diagram illustrating a read operation.

Referring to FIG. 4, the memory device 1100 may read data stored in the memory block 110. For example, when the memory device 1100 reads data stored in memory cells coupled to an eighth word line WL8, the memory device 1100 may apply a read voltage Vread to the selected eighth word line WL8, and a pass voltage Vpass to unselected word lines WL1 to WL7 and WL9 to WL16. The pass voltage Vpass may be applied to turn on memory cells. For example, the pass voltage Vpass may be a voltage of 5V or more.

When a read operation is performed on the memory block 110, data stored in the memory block 110 may be degraded. For example, threshold voltages of memory cells coupled to an unselected word line to which the pass voltage Vpass is applied during the read operation may be increased. In other words, an electric field generated by the pass voltage Vpass may cause more electrons to be trapped in floating gates or charge trap layers of memory cells. As a result, threshold voltages of the memory cells may be increased. This phenomenon may be called "read disturb."

As the number of times a read operation is performed increases, threshold voltages of memory cells may be increased by the read operation. As a result, an error rate of data may be increased during the read operation. For example, when an error rate of the data stored in the memory block 110 is excessively increased, an error correction operation on the data may fail. The memory system 1000 may copy-program the data stored in the memory block 1100 before the error correction operation fails to another memory block 110. This operation may be called a read reclaim operation. In other words, during the read reclaim operation, the data stored in the memory block 110 may be copied-programmed into another memory block 110 when the error rate of the data stored in the memory block 110 is greater than or equal to a predetermined level.

Figure 5:
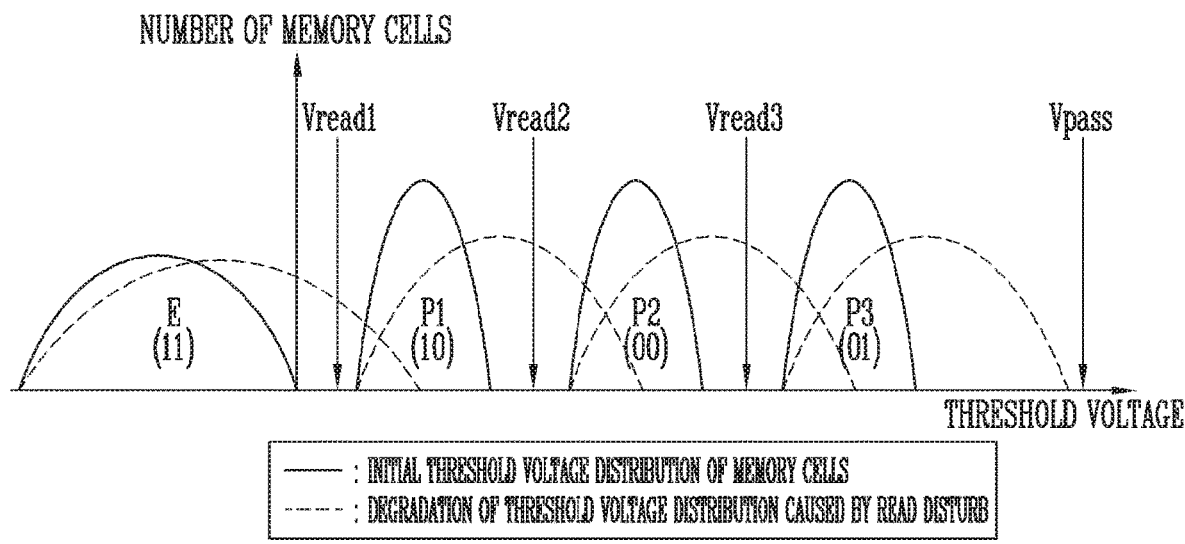
FIG. 5 is a diagram illustrating threshold voltage distributions of memory cells.

FIG. 5 is a simplified block diagram illustrating threshold voltage distributions of memory cells.

Referring to FIG. 5, memory cells coupled to a single word line WL, i.e., a threshold voltage distribution of memory cells included in one physical page PPG may be degraded by a plurality of read operations.

For example, each of the memory cells included in the physical page PPG may store 2-bit data. In other words, one physical page PPG may store two-page data. A threshold voltage distribution of the memory cells included in the one physical page PPG may include an erase threshold voltage distribution E, a first program threshold voltage distribution P1, a second program threshold voltage distribution P2, and a program threshold voltage distribution P3. The erase threshold voltage distribution E, the first program threshold voltage distribution P1, the second program threshold voltage distribution P2, and the third program voltage distribution P3 may correspond to data values '11', '10', '00' and '01', respectively. In other words, when a memory cell stores 2-bit data, a threshold voltage of each of the memory cells included in one physical page PPG may belong to one of the erase threshold voltage distribution E, the first program threshold voltage distribution P1, the second program threshold voltage distribution P2, and the third program threshold voltage distribution P3.

For example, each of the memory cells included in the physical page PPG stores 2-bit data, i.e., least significant bit (LSB) data and most significant bit (MSB) data. For example, when the memory device 1100 reads LSB data stored in memory cells, the memory device 1100 may apply a second read voltage Vread2 to a selected word line and the pass voltage Vpass to unselected word lines. In another example, when the memory device 1100 reads the MSB data stored in memory cells, the memory device 1100 may apply a first read voltage Vread1 and a third read voltage Vread3 to the selected word line and the pass voltage Vpass to the unselected word lines.

As described above with reference to FIG. 4, the data stored in the memory block 110 may be degraded when a plurality of read operations are performed. In other words, when the plurality of read operations are performed on the memory block 110, threshold voltages of memory cells may be increased by an electric field generated by the pass voltage Vpass. As a result, a threshold voltage distribution of the memory cells may be wider than the initial threshold voltage distribution. This phenomenon may be called "read disturb."

When the read disturb widens a threshold voltage distribution of memory cells, an error rate of data may be increased during a read operation. In addition, when the threshold voltage distribution of the memory cells is excessively widened, an error correction operation of data may fail during a read operation.

The memory system 1000 may copy-program the data stored in the memory block 1100 into another memory block 110 before the error correction operation fails. This operation may be called a read reclaim operation. In other words, during the read reclaim operation, the data stored in the memory block 110 may be copied into another memory block 110 when an error rate of the data stored in the memory block 110 is greater than or equal to a predetermined level. The above-described read reclaim operation may be performed before the error rate of the data stored in the memory block 110 is excessively high. The read reclaimed memory block 110 may be reused after an erase operation is performed thereon.

The read reclaim operation of the memory system 1000 may increase the number of program-erase cycles of the memory block 110. Characteristics of the memory block 110 may be degraded as the number of program-erase cycles increases. In other words, an increase in the number of program-erase cycles on which the memory block 110 is performed may cause an increase in the error rate of the data stored in the memory block 110. In other words, an unnecessary read reclaim operation may degrade the reliability of the memory system 1000.

The memory system 1000 may control the memory device 1100 so that the above-described read reclaim operation may be performed before the error rate of the data stored in the memory block 110 is excessively increased. In addition, the memory system 1000 may control the memory device 1100 to avoid performing an unnecessary read reclaim operation.

Figure 6:
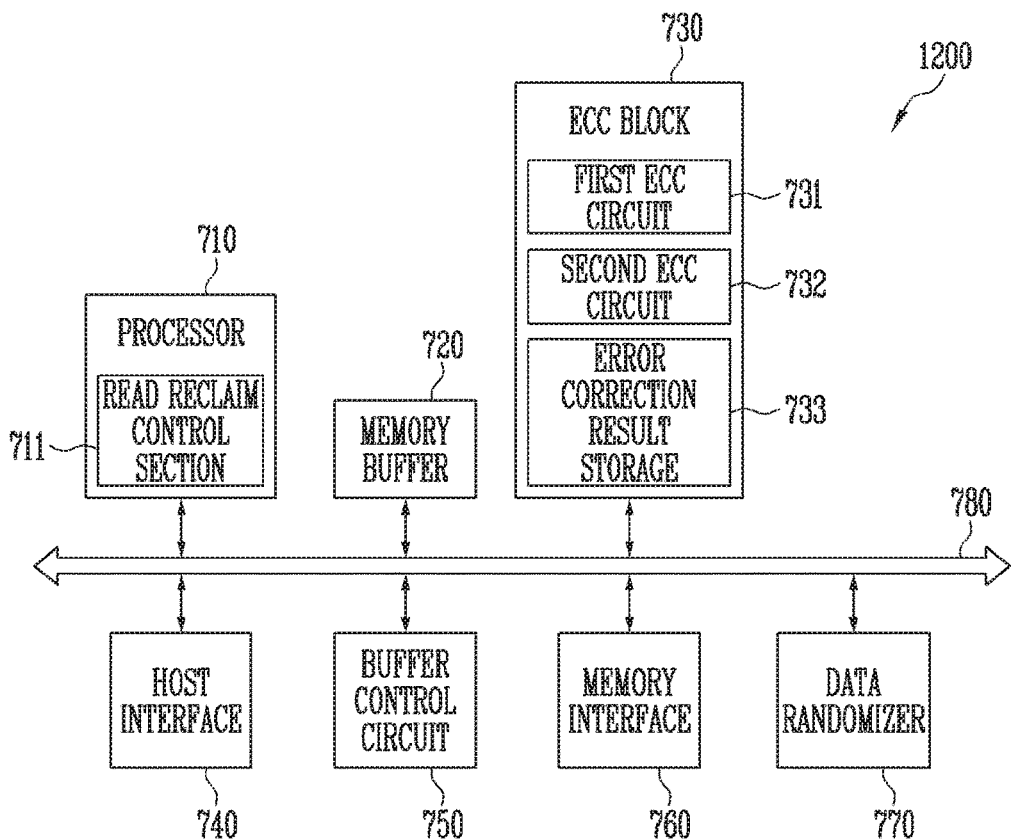
FIG. 6 is a simplified block diagram illustrating a memory controller in accordance with an embodiment.

FIG. 6 is a simplified block diagram illustrating the memory controller 1200 in accordance with an embodiment of the invention.

Referring to FIG. 6, the memory controller 1200 may include a processor 710, a memory buffer 720, an error correction code (ECC) block 730, a host interface 740, a buffer control circuit 750, a memory interface 760, a data randomizer 770, and a bus 780. The processor 710 may include a read reclaim control section 711. In addition, the ECC block 730 may include a first ECC circuit 731, a second ECC circuit 732, and an error correction result storage 733.

The bus 780 may provide communication channels between the various components of the memory controller 1200.

The processor 710 may control the overall operation of the memory controller 1200 and may perform a logical operation. The processor 710 may communicate with an external host 2000 and the memory device 1100 through the host interface 740 and the memory interface 760, respectively. Further, the processor 710 may communicate with the memory buffer 720 through the buffer control circuit 750. The processor 710 may control the operations of the memory system 1000 by using the memory buffer 720 as an operation memory, a cache memory, or a buffer memory.

The memory buffer 720 may be used as an operation memory, a cache memory, or a buffer memory of the processor 710. The memory buffer 720 may store codes and commands executed by the processor 710. The memory buffer 720 may store data that is processed by the processor 710. The memory buffer 720 may include a static RAM (SRAM) or a dynamic RAM (DRAM).

The ECC block 730 may perform error correction. The ECC block 730 may perform ECC encoding based on data to be written into the memory device 1100 through the memory interface 760. The ECC-encoded data may be transferred to the memory device 1100 through the memory interface 760.

The ECC block 730 may perform ECC decoding based on data received from the memory device 1100 through the memory interface 760. For example, the ECC block 730 may be included in the memory interface 760 as one of the components of the memory interface 760.

In addition, the ECC block 730 may include the first ECC circuit 731, the second ECC circuit 732, and the error correction result storage 733.

The first ECC circuit 731 may perform a first error correction operation on data read from the memory device 1100 and received through the memory interface 760. For example, the first ECC circuit 731 may perform the first error correction operation on the basis of Bose-Chaudhuri-Hocquenghem (BCH) codes. In another example, the first ECC circuit 731 may perform the first error correction operation on the basis of 1-bit Bose-Chaudhuri-Hocquenghem (BCH) codes.

When the first error correction operation by the first ECC circuit 731 fails, i.e., when error correction by the first ECC circuit 731 fails on the data received through the memory interface 760, the error correction result storage 733 may store a result of the first error correction operation. In addition, the memory buffer 720 may store the data on which the error correction by the first ECC circuit 731 fails.

When the first ECC circuit 731 fails in correcting errors in the data received through the memory interface 760, the second ECC circuit 732 may perform a second error correction operation on the data on which the first error correction operation fails. For example, the second ECC circuit 732 may perform a second error correction operation on the basis of low-density parity-check (LDPC) codes. In another example, the second ECC circuit 732 may perform the second error correction operation on the basis of 2-bit low-density parity-check (LDPC) codes.

The second ECC circuit 732 may perform the second error correction operation on the data, on which the error correction by the first ECC circuit 731 fails, stored in the memory buffer 720. The second ECC circuit 732 may perform the second error correction operation on the basis of the result of the first error correction operation stored in the error correction storage 733.

The second ECC circuit 732 may have a higher error correction capability than the first ECC circuit 731. The above "error correction capability" may refer to the maximum number of correctable error bits. In other words, the second ECC circuit 732 may successfully correct errors in the data on which the error correction by the first ECC circuit 731 fails.

An operation time for the second ECC circuit 732 to perform the second error correction operation may be longer than an operation time during which the first ECC circuit 731 performs the first error correction operation. For example, the first ECC circuit 731 may perform an error correction operation on the basis of Bose-Chaudhu-Hocquenghem (BCH) codes, and the second ECC circuit 732 may perform an error correction operation on the basis of low-density parity-check (LDPC) codes. In another example, the first ECC circuit 731 may perform an error correction operation on the basis of 1-bit low-density parity-check (LDPC) codes, and the second ECC circuit 732 may perform an error correction operation on the basis of 2-bit low-density parity-check (LDPC) codes. The second ECC circuit 732 may perform a second error correction operation through a plurality of correction loop iterations on the basis of low-density parity-check (LDPC) codes. As a result, the second error correction operation may take a longer time than the first error correction operation.

Power consumed by the second ECC circuit 732 during the second error correction operation may be greater than power consumed by the first ECC circuit 731 during the first error correction operation. For example, the first ECC circuit 731 may perform an error correction operation on the basis of Bose-Chaudhuri-Hocquenghem (BCH) codes, and the second ECC circuit 732 may perform an error correction operation on the basis of low-density parity-check (LDPC) codes. The second ECC circuit 732 may perform the second error correction operation through a plurality of correction loop iterations on the basis of low-density parity-check (LDPC) codes. The second error correction operation may consume more power than the first error correction operation. In the memory controller 1200, an area occupied by the second ECC circuit 732, i.e., the footprint of the second ECC circuit 732 may be greater than that of the first ECC circuit 731. This is because the second ECC circuit 732 may include more transistors than the first ECC circuit 731.

The first ECC circuit 731 may carry out a predetermined number of correction loop iterations during the first error correction operation. For example, when an error correction operation by the first ECC circuit 731 within the predetermined number of correction loop iterations fails, the error correction result storage 733 may store a result of the failed error correction operation. In other words, the error correction result storage 733 may store a result indicating that the error correction operation by the first ECC circuit 731 fails within the predetermined number of correction loop iterations. Subsequently, the second ECC circuit 732 may perform a second error correction operation to perform additional correction loop iterations on the data on which the error correction fails. The second ECC circuit 732 may perform the second error correction operation on the basis of low-density parity-check (LDPC) codes.

In another example, when an error correction operation by the first ECC circuit 731 fails within a predetermined time, the error correction result storage 733 may store a result of the error correction operation. In other words, the error correction result storage 733 may store a result showing that the error correction operation by the first ECC circuit 731 within the predetermined number of correction loop iterations fails. Subsequently, the second ECC circuit 732 may perform a second error correction operation on the failed data during a longer time than the first error correction operation. The second ECC circuit 732 may perform the second error correction operation on the basis of low-density parity-check (LDPC) codes.

The processor 710 may queue a plurality of commands inputted from the host 2000. This operation is referred to herein as a "multi-queue" operation or simply a "multi-queue." The processor 710 may sequentially transfer the plurality of queued tags to the memory device 1100.

The processor 710 may include a read reclaim control section 711 for controlling a read reclaim operation of the memory system 1000. In addition, the read reclaim control section 711 may manage a reclaim list of the memory blocks 110, i.e., a list of the memory blocks 110 on which the read reclaim operation is performed. The read reclaim control section 711 may perform a read reclaim operation on the basis of the reclaim list.

When an error correction operation by the first ECC circuit 731 fails, the ECC block 730 may store a result of the failed error correction operation in the error correction result storage 733. In addition, the ECC block 730 may transfer the result of the error correction operation which is stored in the error correction result storage 733 to the processor 710. The read reclaim control section 711 may update the reclaim list on the basis of the result of the error correction operation performed by the first ECC circuit 731 which is received from the error correction control block 730 and stored in the error correction result storage 733. In other words, when the result of the error correction operation by the first ECC circuit 731 stored in the error correction result storage 733 corresponds to an error correction failure, the processor 710, more particularly, the read reclaim control section 711 of the processor 710 may add the memory block 110 storing the data on which the error correction by the first ECC circuit 731 fails to the reclaim list. Subsequently, the read reclaim control section 711 may perform a read reclaim operation on the memory block 110 storing the data on which the error correction fails on the basis of the reclaim list. For example, the read reclaim operation may be performed when a predetermined number of memory blocks are included in the reclaim list.

In another example, when an error correction operation by the first ECC circuit 731 fails within a predetermined number of iterations, the ECC block 730 may store a result of the failed error correction operation in the error correction result storage 733. In addition, the ECC block 730 may transfer the result of the error correction operation by the first ECC circuit 731 stored in the error correction storage 733 to the processor 710. The read reclaim control section 711 may update the reclaim list on the basis of the result of the error correction operation received from the ECC block 730. In other words, when the result of the error correction operation performed by the first ECC circuit 731 within the predetermined number of iterations stored in the error correction result storage 733 corresponds to an error correction failure, the processor 710, more specifically, the read reclaim control section 711 of the processor 710 may include the memory block 110 storing the data, on which the error correction by the first ECC circuit fails, in the reclaim list. Subsequently, the read reclaim control section 711 may perform a read reclaim operation on the memory block 110 on the basis of the reclaim list.

In another example, when an error correction operation by the first ECC circuit 731 fails within a predetermined time, the ECC block 730 may store a result of the failed error correction operation in the error correction result storage 733. In addition, the ECC block 730 may transfer the result of the failed error correction operation which is stored in the error correction storage 733 to the processor 710. The read reclaim control section 711 may update the reclaim list on the basis of the result of the error correction operation received from the ECC block 730. In other words, the read reclaim control section 711 may include the memory block 110 storing the data on which the error correction by the first ECC circuit 731 fails within the predetermined time in the reclaim list. Subsequently, the read reclaim control section 711 may perform a read reclaim operation on the memory block 110 storing the data on which the error correction fails within the predetermined time on the basis of the reclaim list.

The data of the ECC failure by the first ECC circuit 731 may have a very high error rate. In other words, the memory block 110 storing the data, the first error correction operation to which fails, may be entirely degraded, and the entire data stored in the memory block 110 may have a high error rate. As described above, degradation of a threshold voltage distribution of memory cells by read disturb may result from the pass voltage Vpass. When the first ECC circuit 731 fails error correction on data of a predetermined page included in the memory block 110, a read reclaim operation may be performed on the entire data stored in the corresponding memory block 110. In other words, when the first error correction operation to the predetermined page of memory block 110 by the first ECC circuit 731 fails, a read reclaim operation may be performed on the memory block 110 by the read reclaim control section 711. That is, the read reclaim operation may be performed before the data stored in the memory block 110 is further degraded and the second error correction operation becomes impossible.

The host interface 740 may be configured to communicate with the external host 2000 in response to control of the processor 710. The host interface 740 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Hash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 750 may control the memory buffer 720 under the control of the processor 710.

The memory interface 760 may communicate with the memory device 1100 under the control of the processor 710. The memory interface 760 may transmit/receive commands, addresses, and data to/from the memory device 1100 through a channel.

In an embodiment, the memory controller 1200 may not include the memory buffer 720 and the buffer control circuit 750.

In an embodiment, the processor 710 may control the operations of the memory controller 1200 using codes. The processor 710 may load codes from a nonvolatile memory device (e.g., ROM) provided in the memory controller 1200. In another embodiment, the processor 710 may load codes from the memory device 1100 through the memory interface 760.

The data randomizer 770 may randomize data or de-randomize the randomized data. The data randomizer 770 may perform data randomization on data to be written into the memory device 1100 through the memory interface 760. The randomized data may be transferred to the memory device 1100 through the memory interface 760. The data randomizer 770 may perform data de-randomization on the data received from the memory device 1100 through the memory interface 760. For example, the data randomizer 770 may be included in the memory interface 760 as one of the components of the memory interface 760.

In an embodiment, the bus 780 of the memory controller 1200 may be divided into a control bus and a data bus. In the memory controller 1200, the data bus may be configured to transmit data, and in the memory controller 1200, the control bus may be configured to transmit control information, such as commands or addresses. The data bus and the control bus may be isolated from each other and may neither interfere with nor affect each other. The data bus may be coupled to the host interface 740, the buffer control circuit 750, the ECC block 730, and the memory interface 760. The control bus may be coupled to the host interface 740, the processor 710, the buffer control circuit 750, and the memory interface 760.

Figure 7:
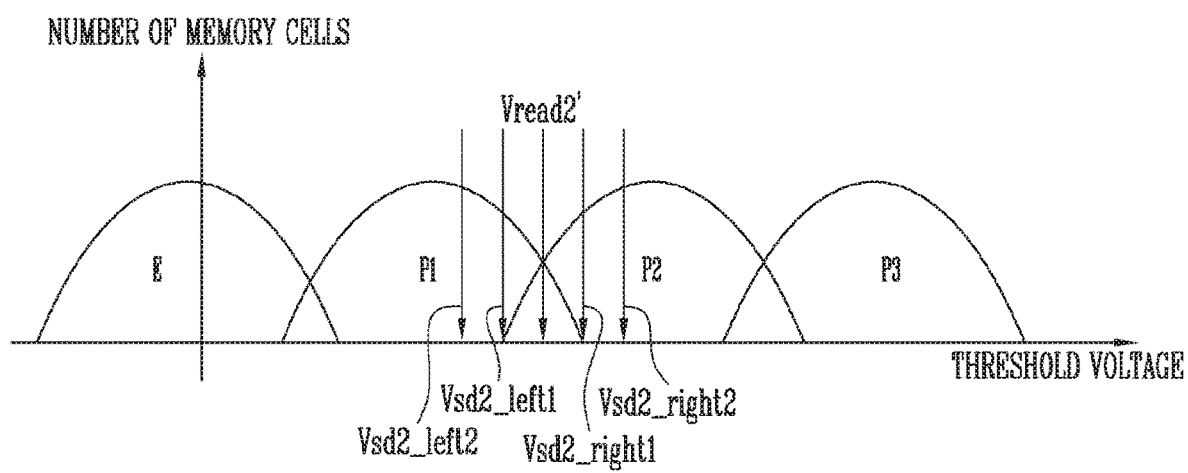
FIG. 7 is a diagram illustrating threshold voltage distributions of memory cells subjected to an error correction operation in accordance with an embodiment.

FIG. 7 is a diagram illustrating threshold voltage distributions of memory cells subject to an error correction operation in accordance with an embodiment of the invention.

Referring to FIG. 7, the ECC block 730 may perform an error correction operation on the basis of a plurality of read voltages.

For example, the first ECC circuit 731 may perform an error correction operation on data which is read by performing a read operation on the basis of a second variable read voltage Vread2'. The data read by the read operation performed on the basis of the second variable read voltage Vread2' may be referred to as "hard data." The second variable read voltage Vread2' may be changed one from the second read voltage Vread2 of FIG. 5 on the basis of the degraded threshold voltage distribution. The first ECC circuit 731 may perform an error correction operation on the basis of Bose-Chaudhuri-Hocquenghem (BCH) codes.

For example, when an error correction operation by the first ECC circuit 731 fails on the hard data which is read by performing the read operation on the basis of the second variable read voltage Vread2', the second ECC circuit 732 may perform an error correction operation on the hard data using first soft data which is read by performing a read operation on the basis of a first left soft read voltage Vsd2_left1 and a first right soft read voltage Vsd2_right1. In addition, the second ECC circuit 732 may perform an error correction operation on the hard data using second soft data which is read by performing a read operation on the basis of a second left soft read voltage Vsd2_left2 and a second right soft read voltage Vsd2_right2. The second ECC circuit 732 may perform an error correction operation on the basis of low-density parity-check (LDPC) codes.

In another example, when an error correction operation by the first ECC circuit 731 fails on the hard data which is read by performing the read operation on the basis of the second variable read voltage Vread2', the first ECC circuit 731 may perform an error correction operation on the hard data using the first soft data read by performing a read operation on the basis of the first left soft read voltage Vsd2_left1 and the first right soft read voltage Vsd2_right1. The first ECC circuit 731 may perform an error correction operation on the basis of 1-bit low-density parity-check (LDPC) codes.

For example, when an error correction operation by the first ECC circuit 731 fails on the hard data which is read by performing the read operation on the basis of the second variable read voltage Vread2', the second ECC circuit 732 may perform an error correction operation on the hard data using the first soft data which is read by performing the read operation on the basis of the first left soft read voltage Vsd2_left1 and the first right soft read voltage Vsd2_right1 and the second soft data which is read by performing the read operation on the basis of the second left soft read voltage Vsd2_left2 and the second right soft read voltage Vsd2_right2. The second ECC circuit 732 may perform an error correction operation on the basis of 2-bit low-density parity-check (LDPC) codes.

Figure 8:
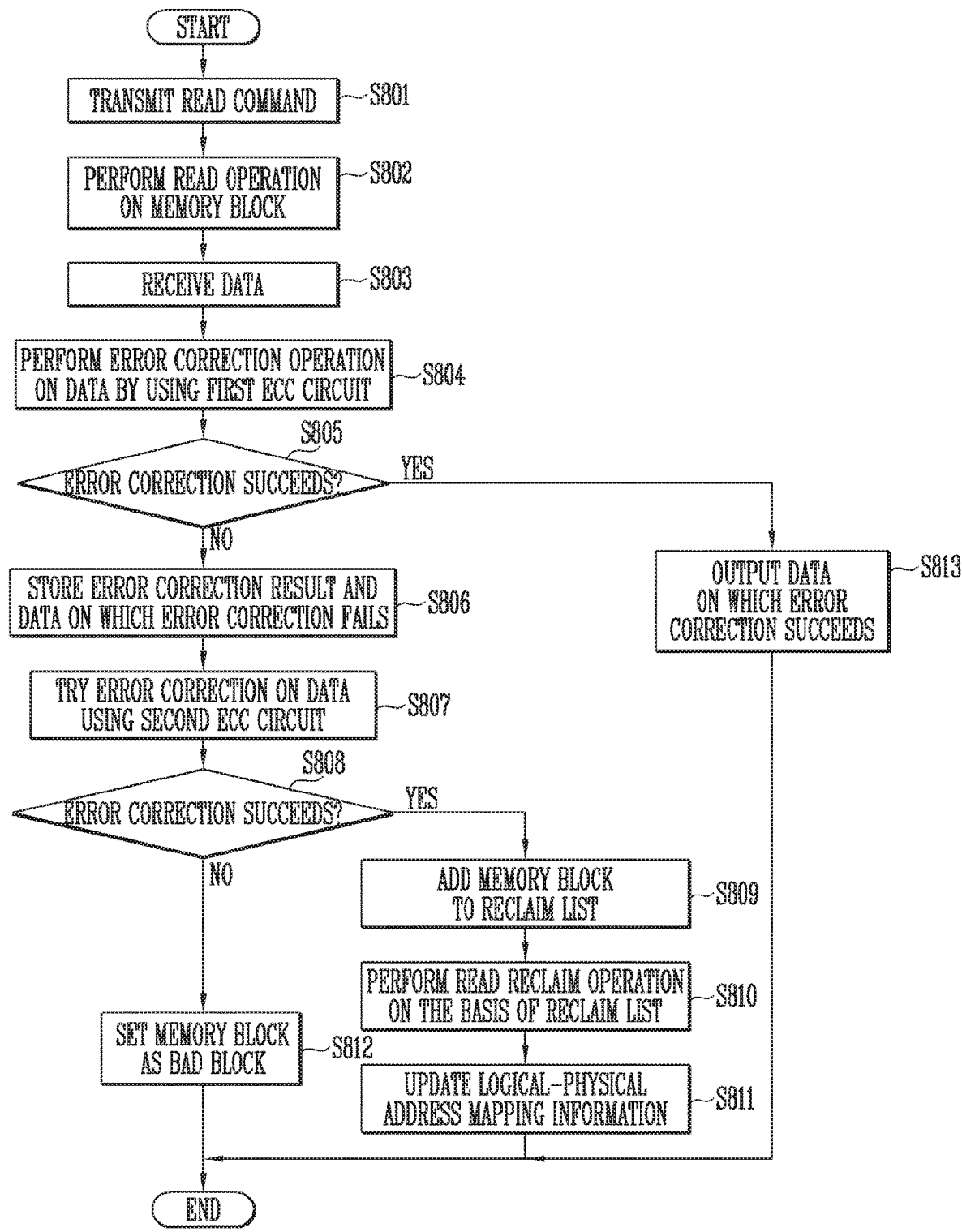
FIG. 8 is a flowchart illustrating a read reclaim operation in accordance with an embodiment.

FIG. 8 is a flowchart illustrating a read reclaim operation in accordance with an embodiment of the invention.

Referring to FIG. 8, the memory controller 1200 may transmit a read command to the memory device 1100 at step S801.

The memory device 1100 may perform a read operation on the memory block 110 in response to the read command at step S802, and the memory controller 1200 may receive data which is read by performing a read operation from the memory device 1100 at step S803.

The memory controller 1200 may perform an error correction operation on the data received from the memory device 1100 by using the first ECC circuit 731 at step S804.

When the error correction operation by the first ECC circuit 731 fails ('No' at step S805), the error correction result storage 733 of the memory controller 1200 may store an error correction result of the first ECC circuit 731 and the memory buffer 720 may store the data on which the error correction of the first ECC circuit 731 fails at step S806.

Subsequently, the memory controller 1200 may perform an error correction operation on the data received from the memory device 1100 by using the second ECC circuit 732 at step S807. In another example, the second ECC circuit 732 may perform an error correction operation on the data, on which the error correction by the first ECC circuit 731 fails, stored in the memory buffer 720.

When the error correction operation by the second ECC circuit 732 on the data, on which the error correction by the first ECC circuit 731 fails, succeeds ('Yes' at step S808), the read reclaim control section 711 of the processor 710 may add the memory block 110 storing the data, on which the error correction by the first ECC circuit 731 fails, to the reclaim list on the basis of a failure of the error correction operation by the first ECC circuit 731 at step S809.

In another example, step S809 may be performed between step S805 and step S807. In other words, when the error correction operation on the data by using the first ECC circuit 731 fails ('No' at step S805), the memory block 110 may be added to the reclaim list at step S809. In another example, step S809 may be performed in parallel with step S806 or S807.

Subsequently, the read reclaim control section 711 may perform a read reclaim operation on the memory block 110 using the reclaim list at step S810.

The memory controller 1200 may update logical-to-physical address mapping information on the memory block 110 after the read reclaim operation at step S811.

When the error correction operation by the second ECC circuit 732 fails ('No' at step S808), the memory controller 1200 may set the memory block 110 as a bad block at step S812.

When the error correction operation by the first ECC circuit 731 succeeds ('Yes' at step S805), the data on which the error correction succeeds may be outputted to the host 2000 at step S813.

For example, the first ECC circuit 731 may perform an error correction operation on the basis of Bose-Chaudhuri-Hocquenghem (BCH) codes. In addition, the second ECC circuit 732 may perform an error correction operation on the basis of low-density parity-check (LDPC) codes. In another example, the first ECC circuit 731 may perform an error correction operation on the basis of 1-bit low-density parity-check (LDPC) codes. In addition, the second ECC circuit 732 may perform an error correction operation on the basis of 2-bit low-density parity-check (LDPC) codes.

Figure 9:
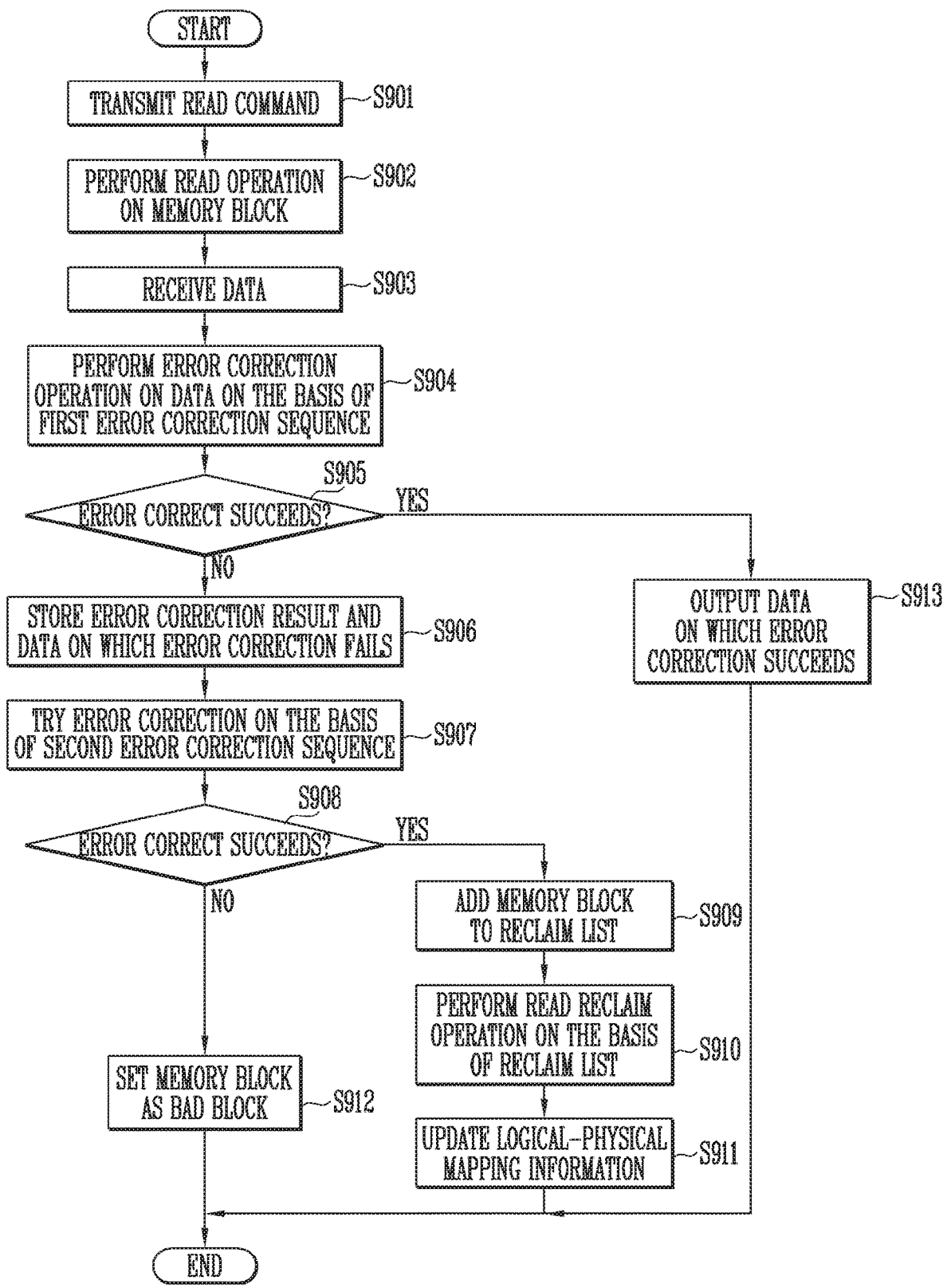
FIG. 9 is a flowchart illustrating a read reclaim operation in accordance with another embodiment.

FIG. 9 is a flowchart illustrating a read reclaim operation in accordance with an embodiment.

Referring to FIG. 9, the memory controller 1200 may transmit a read command to the memory device 1100 at step S901.

The memory device 1100 may perform a read operation on the memory block 110 in response to the read command at step S902, and the memory controller 1200 may receive data which is read by the read operation from the memory device 1100 at step S903.

The memory controller 1200 may perform an error correction operation on the data received from the memory device 1100 on the basis of a first error correction sequence at step S904. For example, the first error correction sequence may include an error correction operation based on Bose-Chaudhuri-Hocquenghem (BCH) codes. In another example, the first error correction sequence may include an error correction operation performed using 1-bit soft data based on low-density parity-check (LDPC) codes. In another example, the first error correction sequence may include a predetermined number of correction loop iterations. In addition, in accordance with the first error correction sequence, an error correction operation may be performed with a predetermined time.

When the error correction operation based on the first error correction sequence fails ('No' at step S905), the error correction result storage 733 of the memory controller 1200 may store an error correction result of the first error correction sequence and the memory buffer 720 may store the data on which the first error correction sequence fails at step S906.

Subsequently, the memory controller 1200 may perform an error correction operation on the data received from the memory device 1100 on the basis of a second error correction sequence at step S907. In another example, the memory controller 1200 may perform an error correction operation on the data, on which the error correction based on the first error correction sequence fails, stored in the memory buffer 720 on the basis of the second error correction sequence. For example, the second error correction sequence may include an error correction operation performed based on low-density parity-check (LDPC) codes. In another example, the second error correction sequence may include an error correction operation performed using 2-bit soft data based on low-density parity-check (LDPC) codes.

When the error correction operation based on the second error correction sequence on the data, on which the first error correction sequence fails, succeeds ('Yes' at step S908), the read reclaim control section 711 of the processor 710 may add the memory block 110 storing the data, on which the first error correction sequence fails, to the reclaim list on the basis of a failure of the error correction operation based on the first error correction sequence at step S909.

In another example, step S909 may be performed between step S905 and step S907. In other words, when the error correction operation based on the first error correction sequence fails ('No' at step S905), the memory block 110 may be added to the reclaim list at step S909. In another example, step S909 may be performed in parallel with step S906 or S907.

Subsequently, the read reclaim control section 711 may perform a read reclaim operation on the memory block 110 on the basis of the reclaim list at step S910.

The memory controller 1200 may update logical-to-physical address mapping information on the memory block 110 after the read reclaim operation at step S911.

When the error correction operation based on the second error correction sequence fails ('No' at step S908), the memory controller 1200 may set the memory block 110 as a bad block at step S912.

When the error correction operation by the first error correction sequence succeeds ('Yes' at step S905), the data on which the error correction succeeds may be outputted to the host 2000 at step S913.

Figure 10:
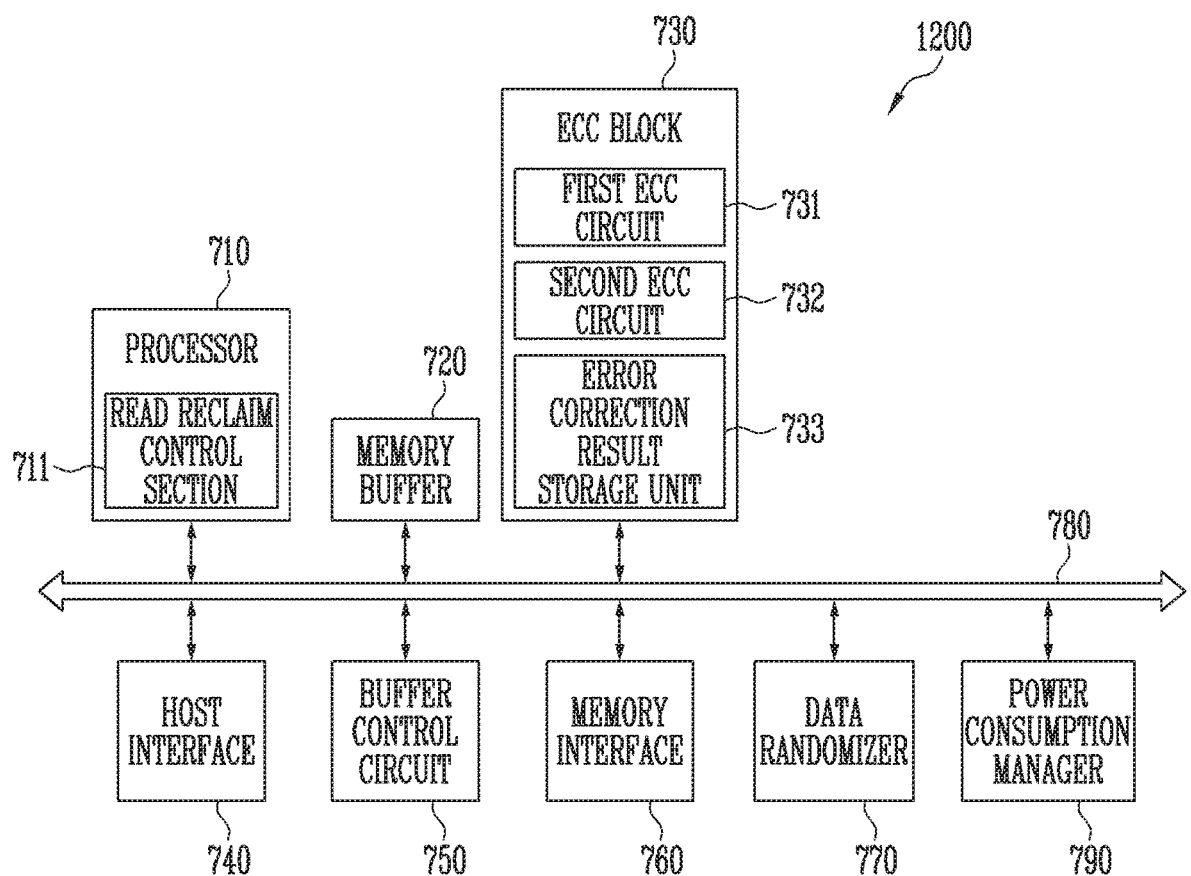
FIG. 10 is a simplified block diagram illustrating a memory controller in accordance with an embodiment.

FIG. 10 is a simplified block diagram illustrating a memory controller in accordance with another embodiment.

Referring to FIG. 10, the memory controller 1200 may further include a power consumption manager 790 in comparison with the memory controller described above with FIG. 6. The power consumption manager 790 may manage the entire power consumption of the memory system 1000. For example, the power consumption manager 790 may assign a predetermined amount of a power budget to the non-volatile memory device 1100. The non-volatile memory device 100 may operate with the assigned power budget. For example, the power consumption manager 790 may assign a predetermined amount of a power budget to each of various components in the memory controller 1200, for example, the processor 710, the memory buffer 720, the ECC block 730, the host interface 740, the buffer control circuit 750, the memory interface 760, and the data randomizer 770. Each of these components may operate within its assigned power budget.

In another example, the power consumption manager 790 may monitor the entire amount of power currently being consumed by the memory system 1000. For example, when the power consumption of the memory system 1000 is large, the power consumption manager 790 may temporarily hold off on starting a new operation by each of various components in the memory controller 1200, for example, the processor 710, the memory buffer 720, the ECC block 730, the host interface 740, the buffer control circuit 750, the memory interface 760, and the data randomizer 770. When the entire power consumption of the memory system 1000 decreases to a predetermined level or less, the power consumption manager 790 may control the various components in the memory controller 1200 to start the on-hold operation.

For example, the processor 710 of the memory controller 1200 may receive read data from the non-volatile memory device 1100 during a read operation, request the power consumption manager 790 for information indicating whether an available power budget is greater than or equal to a reference value, and directly perform an error correction operation on the read data by using the second ECC circuit 732 without an error correction operation by the first ECC circuit 731 when the available power budget is greater than or equal to the reference value.

In another example, the processor 710 of the memory controller 1200 may receive the read data from the non-volatile memory device 100 during a read operation and perform an error correction on the read data by using the first ECC circuit 731. When the error correction on the read data by using the first ECC circuit 731 fails, the processor 710 may request the power consumption manager 790 to assign a power budget for an error correction operation on the read data by using the second ECC circuit 732 before performing the error correction operation on the read data by using the second ECC circuit 732. The processor 710 may receive the power budget, assigned by the power consumption manager 790, for the error correction operation on the read data by the second ECC circuit 732, and may perform the error correction operation on the read data by using the second ECC circuit 732.

Figure 11:
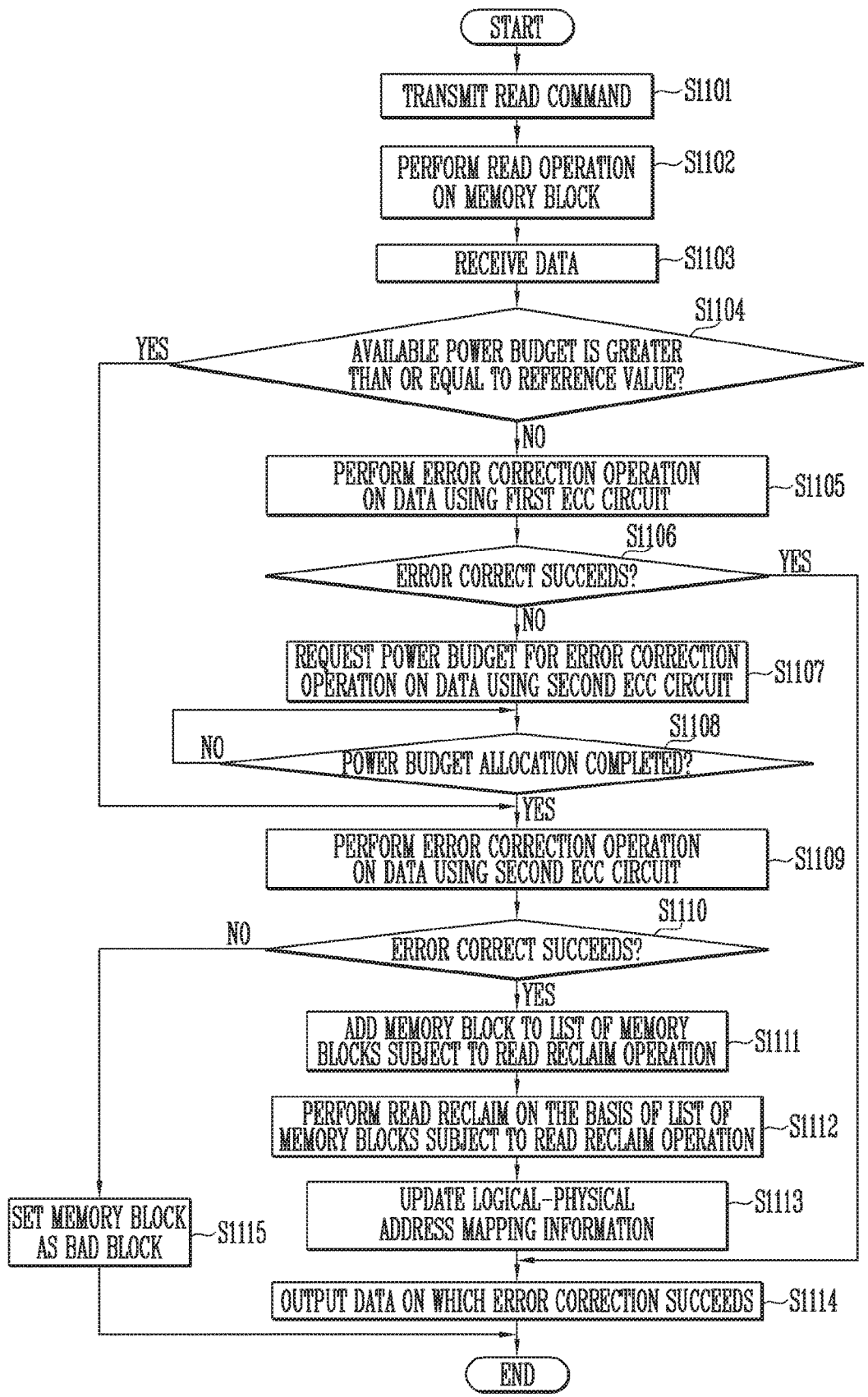
FIG. 11 is a flowchart illustrating a read reclaim operation in accordance with an embodiment.

FIG. 11 is a flowchart illustrating a read reclaim operation in accordance with another embodiment.

Referring to FIG. 11, the memory controller 1200 may transmit a read command to the memory device 1100 at step S1101. The memory device 1100 may perform a read operation on the memory block 110 in response to the read command at step S1102, and the memory controller 1200 may receive data which is read from the memory device 1100 through a read operation at step S1103.

The power consumption manager 790 may check whether the available power budget is greater than or equal to a reference value in response to the request from the processor 710 at step S1104. When the available power budget is not greater than or equal to the reference value ('No' at step S1104), the memory controller 1200 may perform an error correction operation on data by using the first ECC circuit 731 at step S1105.

When the error correction operation by the first ECC circuit 731 fails ('No' at step S1106), the error correction result storage 733 of the memory controller 1200 may store an error correction result and the memory buffer 720 may store the data on which the error correction fails. In addition, the processor 710 may request the power consumption manager 790 for a power budget for an error correction operation on data by using the second ECC circuit 732 at step S1107.

When the power consumption manager 790 finishes allocating the power budget for the error correction operation on the data by using the second ECC circuit 732 ('Yes' at step S1108), the memory controller 1200 may perform the error correction operation on the data received from the memory device 1100 by using the second ECC circuit 732 at step S1109. In another example, by using the second ECC circuit 732, the memory controller 1200 may perform an error correction operation on the data, on which the error correction by the first ECC circuit 731 fails, stored in the memory buffer 720.

When the error correction operation by the second ECC circuit 732 succeeds ('Yes' at step S1110), the read reclaim control section 711 of the processor 710 may add the memory block 110 storing the data to the reclaim list on the basis of a failure of the error correction operation by the first ECC circuit 731 at step S1111. In another example, when the error correction operation on the data by using the first ECC circuit 731 fails ('No' at step S1106), the memory block may be added to the reclaim list at step S1111.

Subsequently, the read reclaim control section 711 may perform a read reclaim operation on the memory block 110 on the basis of the reclaim list at step S1112. The memory controller 1200 may update logical-to-physical address mapping information on the memory block 110 after the read reclaim operation at step S1113. Subsequently, the memory controller 1200 may output the data on which the error correction succeeds to the host 2000 at step S1114.

When the error correction operation by the second ECC circuit 732 fails ('No' at step S1110), the memory controller 1200 may set the memory block 110 as a bad block at step S1115.

When the available power budget is equal to or greater than a reference value ('Yes' at S1104), the memory controller 1200 may directly perform an error correction operation on data by using the second ECC circuit 732 without performing an error correction operation using the first ECC circuit 731 at step S1109.

For example, steps S1111 to S1113 may be performed when the error correction operation by the second ECC circuit 732 succeeds ('Yes' at S1110) and an error rate of the data is a predetermined level or more. For example, when the available power budget at step S1104 is greater than or equal to the reference value ('Yes' at step S1104), the memory controller 1200 may skip an error correction operation on data using the first ECC circuit 731 and perform an error correction operation on the data by using the second ECC circuit 732 at step S1109. In this example, steps S1111 to S1113 may be performed when an error rate of the data checked by the error correction operation performed by the second ECC circuit 732 is the predetermined level or more.

When power budget allocation for the error correction operation on the data by using the second ECC circuit 732 by the power consumption manager 790 is not completed ('No' at step S1108), the processor 710 may hold off on perform step S1109 until the power budget is allocated.

Figure 12:
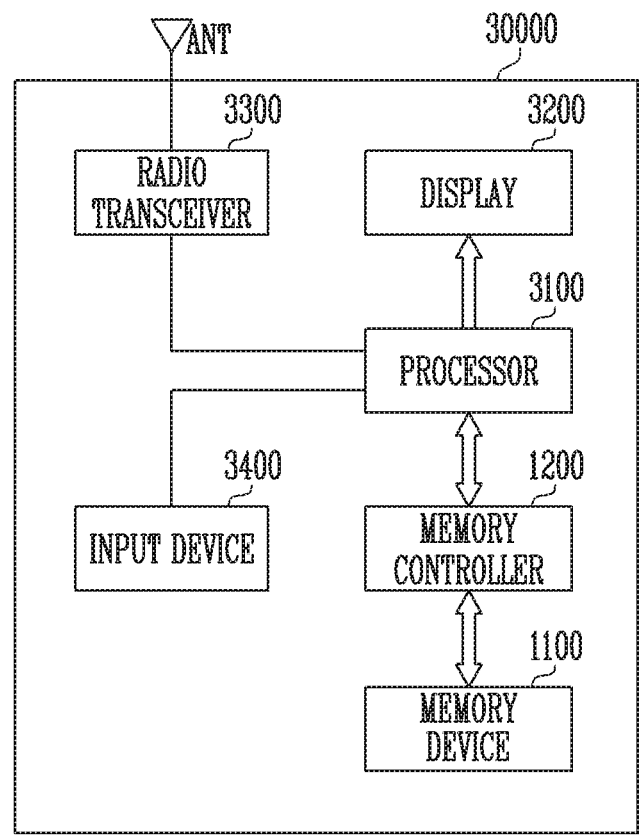
FIG. 12 is a simplified block diagram illustrating another embodiment of a memory system including a memory controller as shown in FIG. 6.

FIG. 12 is a simplified block diagram illustrating another embodiment of the memory system including the memory controller as shown in FIG. 6.

Referring to FIG. 12, a memory system 30000 may be embodied in a cellular phone, a smartphone, a tablet PC, a personal digital assistant (PDA) or a wireless communication device. The memory system 30000 may include the memory device 1100 and the memory controller 1200 controlling the operations of the memory device 1100. The memory controller 1200 may control a data access operation of the memory device 1100, for example, a program operation, an erase operation or a read operation in response to control of the processor 3100.

The memory controller 1200 may control data programmed into the memory device 1100 to be output through a display 3200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the semiconductor memory device 1100. In addition, the radio transceiver 3300 may change a signal output from the processor 3100 into a radio signal, and output the radio signal to an external device through the antenna ANT. A control signal for controlling the operations of the processor 3100 or data to be processed by the processor 3100 may be input by the input device 3400, and the input device 3400 may include a pointing device, such as a touch pad and a computer mouse, a keypad, a keyboard or a combination thereof. The processor 3100 may control the operations of the display 3200 so that data output from the memory controller 1200, data output from the radio transceiver 3300, or data output from the input device 3400 may be outputted through the display 3200.

In accordance with an embodiment, the memory controller 1200 controlling the operations of the memory device 1100 may form part of the processor 3100, or be formed as a separate chip from the processor 3100. Further, the memory controller 1200 may be implemented through the example of the memory controller illustrated in FIG. 6.

Figure 13:
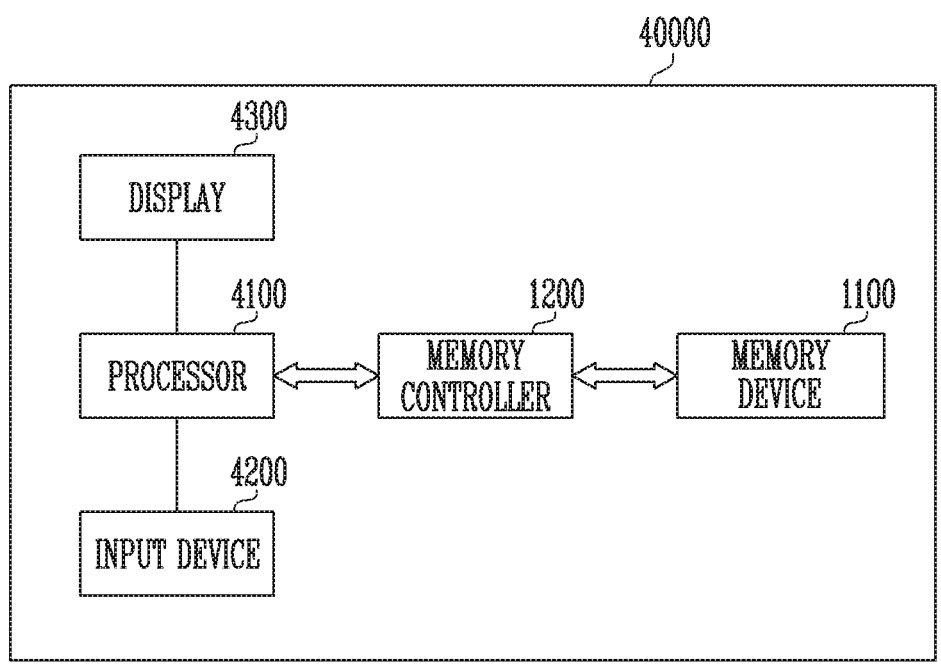
FIG. 13 is a simplified block diagram illustrating another embodiment of a memory system including a memory controller as shown in FIG. 6.

FIG. 13 is a simplified block diagram illustrating another embodiment of the memory system including the memory controller as shown in FIG. 6.

Referring to FIG. 13, a memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

A processor 4100 may output data stored in the memory device 1100 through a display 4300 according to data input through an input device 4200. Examples of the input device 4200 may include a pointing device such as a touch pad or a computer mouse, a keypad, a keyboard or a combination thereof.

The processor 4100 may control the general operations of the memory system 40000 and control the operations of the memory controller 1200. In accordance with an embodiment, the memory controller 1200 controlling the operations of the memory device 1100 may be part of the processor 4100, or be formed as a separate chip from the processor 4100. Further, the memory controller 1200 may be implemented through the example of the memory controller illustrated in FIG. 6.

Figure 14:
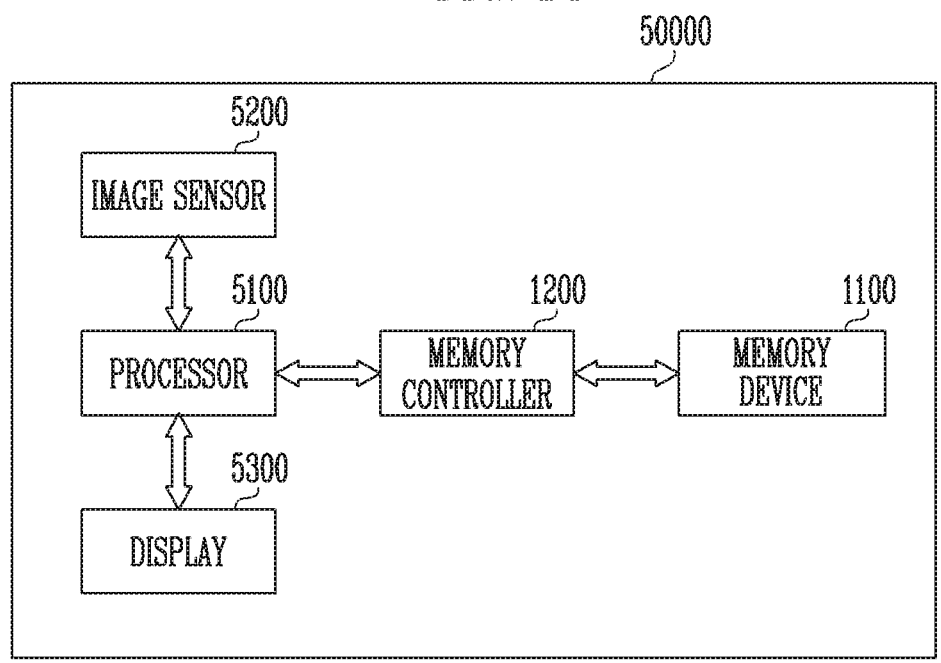
FIG. 14 is a simplified block diagram illustrating another embodiment of a memory system including a memory controller as shown in FIG. 6.

FIG. 14 is a simplified block diagram illustrating another embodiment of the memory system including the memory controller as shown in FIG. 6.

Referring to FIG. 14, a memory system 50000 may be embodied into an image processor, for example, a digital camera, a cellular phone with a digital camera attached thereto, a smart phone with a digital camera attached thereto, or a table PC with a digital camera attached thereto.

The memory system 50000 may include the memory device 1100 and the memory controller 1200 controlling a data processing operation of the memory device 1100, for example, a program operation, an erase operation, or a read operation.

An image sensor 5200 of the memory system 50000 may convert an optical image into digital signals, and the converted digital signals may be transferred to the processor 5100 or the memory controller 1200. In response to control of the processor 5100, the converted digital signals may be outputted through the display 5300 or stored in the semiconductor memory device 1100 through the memory controller 1200. In addition, the data stored in the memory device 1100 may be outputted through the display 5300 according to control of the processor 5100 or the memory controller 1200.

In accordance with an embodiment, the memory controller 1200 controlling the operations of the memory device 1100 may be part of the processor 5100 or be formed as a separate chip from the processor 5100. Further, the memory controller 1200 may be implemented through the example of the memory controller illustrated in FIG. 6.

Figure 15:
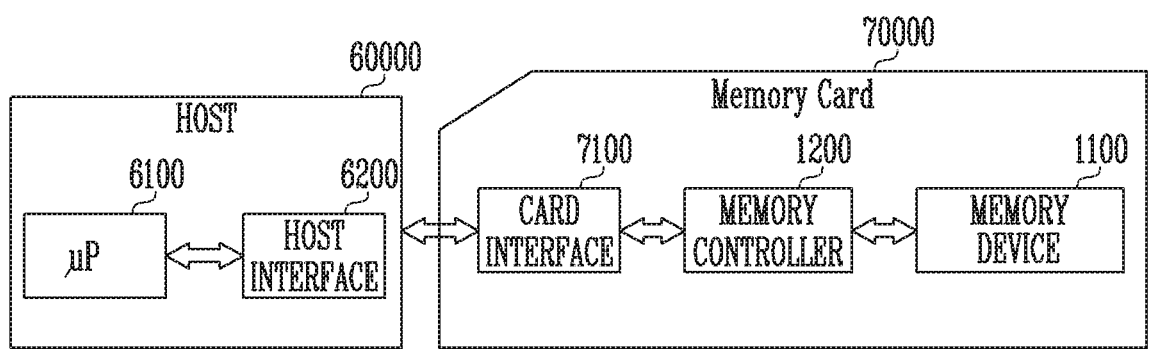
FIG. 15 is a simplified block diagram illustrating another embodiment of a memory system including a memory controller as shown in FIG. 6.

FIG. 15 is a simplified block diagram illustrating another embodiment of the memory system including the memory controller as shown in FIG. 6.

Referring to FIG. 15, a memory system 70000 may include a memory card or a smart card. The memory system 70000 may include the memory device 1100, the memory controller 1200, and a card interface 7100.

The memory controller 1200 may control a data exchange between the semiconductor memory device 1100 and the card interface 7100. In an embodiment, the card interface 7100 may be a secure digital (SD) card interface or a multimedia card (MMC) interface, but it is not limited thereto. Further, the memory controller 1200 may be implemented through the example of the memory controller illustrated in FIG. 6.

The card interface 7100 may interface a data exchange between a host 60000 and the memory controller 1200 according to a protocol of the host 60000. In accordance with an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

In accordance with the present disclosure, in association with operations of a memory system, a read reclaim operation of the memory system may be efficiently performed using a first ECC circuit and a second ECC circuit having more excellent error correction capability.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A method of operating a memory system, the method comprising:
reading, by a controller, first data from a first memory block;
requesting an available power budget for an error correction operation to a power consumption manager;
performing a first error correction on the first data using a first error correction (ECC) circuit in response to the available power budget less than a reference value;
requesting the available power budget that is greater than or equal to the reference value to the power consumption manager in response to a failure of the first error correction;
performing a second error correction on the first data using a second ECC circuit after the available power budget that is greater than or equal to the reference value is allocated; and
performing, by the controller, a read reclaim operation on the first memory block in response to a success of the second error correction,
wherein power consumed by the second ECC circuit during the second error correction is greater than power consumed by the first ECC circuit during the first error correction.

2. The method of claim 1, wherein the read reclaim operation comprises:
reading second data from the first memory block;
performing an error correction on the second data using the first ECC circuit or the second ECC circuit; and
programming a second memory block with the first and second data on which the error correction is performed.

3. The method of claim 1, wherein the second ECC circuit has a higher error correction capability than the first ECC circuit.

4. The method of claim 3, wherein the second error correction takes a longer operation time than the first error correction.

5. The method of claim 1,
further comprising storing the first data, on which the first error correction by the first ECC circuit fails, in a memory buffer,
wherein the second error correction is performed on the first data stored in the memory buffer.

6. The method of claim 1,
further comprising adding the first memory block to a reclaim list,
wherein the read reclaim operation is performed based on the reclaim list.

7. The method of claim 1, further comprising checking whether the available power budget is greater than or equal to the reference value before performing the first error correction.

8. The method of claim 1, wherein the second error correction is performed when the first error correction on the first data fails within a predetermined number of iterations during the first error correction.

9. The method of claim 1,
further comprising a second read operation for reading soft data from the first memory block, and wherein the second error correction is performed using the soft data.

10. The method of claim 1, further comprising:
reading first soft data from the first memory block on the basis of a first read condition; and
reading second soft data from the first memory block on the basis of a second read condition,
wherein the first error correction is performed on the basis of the first soft data, and
wherein the second error correction is performed based on the first soft data and the second soft data.

11. A memory system, comprising:
a first memory block and a second memory block;
a first ECC circuit performing a first error correction operation on data read from the first memory block in response to a power budget less than a predetermined value;
a second ECC circuit performing a second error correction operation on the data when the first error correction operation fails; and
a read reclaim control section performing a read reclaim operation to copy-program data stored in the first memory block to the second memory block in response to the power budget greater than or equal to the predetermined value,
wherein the second ECC circuit has a higher error correction capability than the first ECC circuit and performs the second error correction operation on the data after the first error correction operation fails and the power budget that is greater than or equal to the predetermined value is allocated, and
wherein power consumed by the second ECC circuit during the second error correction operation is greater than power consumed by the first ECC circuit during the first error correction operation.

12. The memory system of claim 11,
further comprising a power consumption manager managing power consumption,
wherein the second ECC circuit performs the second error correction operation when the power budget is allocated by the power consumption manager.

13. The memory system of claim 11,
further comprising a memory buffer storing the data on which the first error correction operation fails,
wherein the second ECC circuit performs the second error correction operation on the data stored in the memory buffer.

14. The memory system of claim 11,
wherein the first ECC circuit performs the first error correction operation on the basis of Bose-Chaudhuri-Hocquenghem (BCH) codes, and
wherein the second ECC circuit performs the second error correction operation on the basis of low-density parity-check (LDPC) codes.

15. The memory system of claim 11,
further comprising an error correction result storage device storing a result of the first error correction operation and transmitting the result to the read reclaim control section,
wherein the read reclaim control section performs the read reclaim operation based on the result.

16. A method of operating a memory system, the method comprising:
reading data from a memory block;
performing a first error correction operation on the data based on a first error correction sequence in response to an available power budget less than a reference value;
requesting the available power budget that is greater than or equal to the reference value to a power consumption manager in response to a failure of the first error correction operation;
performing a second error correction operation on the data based on a second error correction sequence after the available power budget that is greater than or equal to the reference value is allocated;
adding information of the memory block to a reclaim list in response to the failure of the first error correction operation; and
performing a read reclaim operation based on the reclaim list,
wherein power consumed during the second error correction operation is greater than power consumed during the first error correction operation.

17. The method of claim 16, wherein the read reclaim operation is performed when a number of memory blocks included in the reclaim list is greater than or equal to a predetermined level.

18. The method of claim 16,
further comprising reading soft data from the memory block,
wherein the second error correction operation is performed using the soft data.

* * * * *